(12) United States Patent
Yang et al.

(10) Patent No.: US 7,645,546 B2
(45) Date of Patent: Jan. 12, 2010

(54) METHOD FOR DETERMINING AN OVERLAY CORRELATION SET

(75) Inventors: Chin-Cheng Yang, Hsinchu (TW); Chih-Hao Huang, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 677 days.

(21) Appl. No.: 11/348,830

(22) Filed: Feb. 6, 2006

(65) Prior Publication Data

US 2007/0184628 A1 Aug. 9, 2007

(51) Int. Cl.
*G03C 5/00* (2006.01)
*G03F 9/00* (2006.01)
(52) U.S. Cl. .......................................... 430/22; 430/30
(58) Field of Classification Search .................. 430/22, 430/30
See application file for complete search history.

(56) References Cited

U.S. PATENT DOCUMENTS 7,184,853 B2 * 2/2007 Roberts et al. .............. 700/124

* cited by examiner

*Primary Examiner*—Christopher G Young
(74) *Attorney, Agent, or Firm*—J.C. Patents (57) ABSTRACT

The invention is directed to a method for determining an overlay correlation set between two successive patterned material layers on a substrate. The method comprises steps of providing a first material layer having a first overlay mark formed therein over the substrate and then using an exposure tool with a first overlay correlation set to form a patterned photoresist layer on the first material layer, wherein the patterned photoresist layer comprises a mark pattern and the mark pattern is located over the first overlay mark for defining a later formed second material layer on the first material layer to be a second overlay mark. Thereafter, a pre-process metrology overlay parameter set between the first overlay mark and the mark pattern is obtained. The first overlay correlation set at the exposure tool is adjusted according to the pre-process metrology overlay parameter set.

11 Claims, 5 Drawing Sheets

METHOD FOR DETERMINING AN OVERLAY CORRELATION SET

BACKGROUND OF THE INVENTION

1. Field of Invention

The present invention relates to a method for determining an overlay correlation set. More particularly, the present invention relates to a method for determining an overlay correlation set with excluding manufacturing variables.

2. Description of Related Art

In the manufacture of integrated circuit, photolithography process is used to transfer patterns from a photo mask having customized circuit patterns to thin films formed on a wafer. The image transfer process comprises steps of forming a photoresist layer on a non-process layer, illuminating the photoresist layer through a photo mask having the customized circuit patterns, developing the photoresist layer and then etching the non-process layer by using the patterned photoresist layer as a mask. Hence, the image transfer process is accomplished. For a well-manufactured integrated circuit product, the image transfer process mentioned above is performed several times to transfer the circuit patterns to each non-process layers to form the electrically circuit device. Therefore, it is important to align the successive patterned layers to reduce the misalignment errors as the critical dimension of the semiconductor device becomes smaller and smaller.

Figure 1:
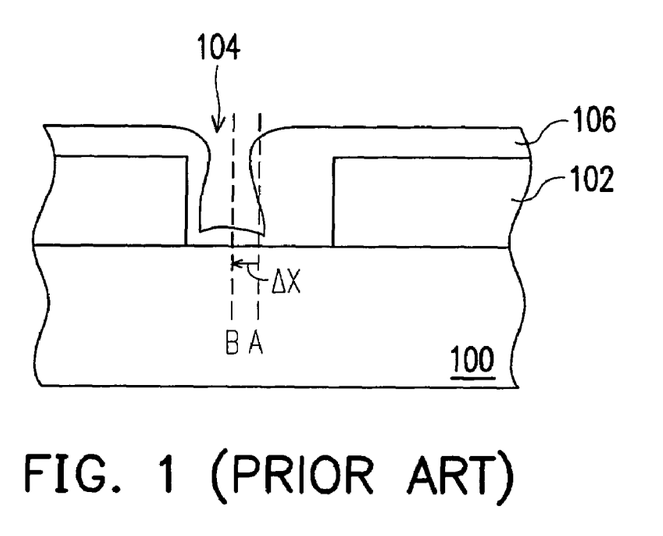
FIG. 1 is a cross-sectional view showing the self-shadowing effect.
Figure 2:
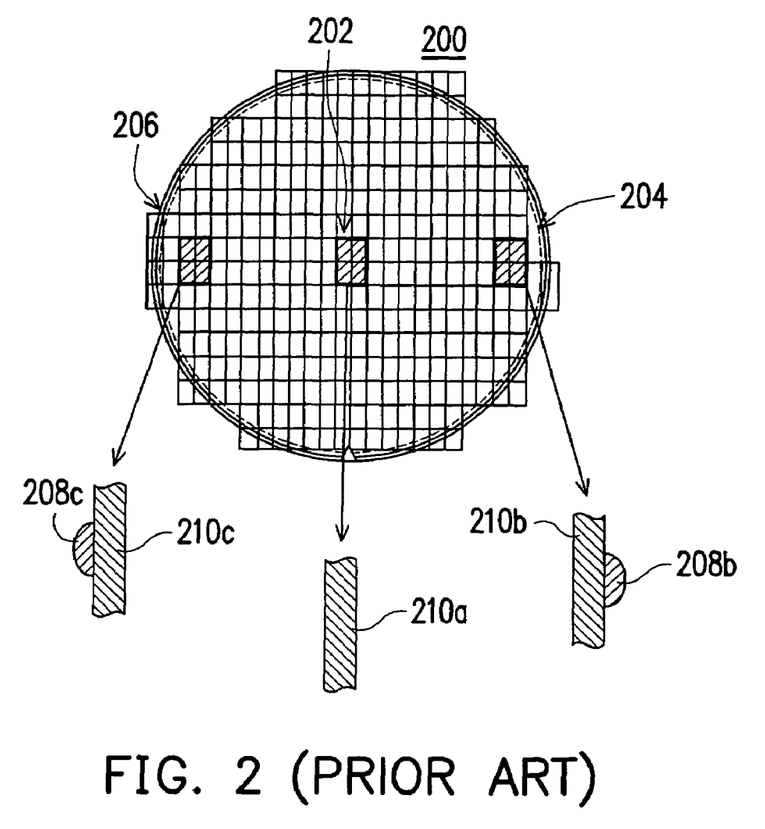
FIG. 2 is a top view showing the overlay results between two patterned successive material layers in different positions on a wafer.

Typically, the overlay correlation set in an exposure tool is used to insure the alignment precision between the successive patterned layers. However, the overlay correlation set is seriously affected by the manufacturing variables. FIG. 1 is a cross-sectional view of the overly mark and the distortion phenomenon due to the self-shadowing effect. FIG. 2 is a top view showing the overlay results between two patterned successive material layers in different positions on a wafer. During a material film is formed by performed a deposition process, the incident angles of deposited particles on both sidewalls of the overlay mark is different. The incident angles of the deposited particles become large from the wafer center to the wafer edge. Accordingly, the thicknesses of the material film on both sidewalls of the overlay mark are different and the unbalanced thicknesses at both sidewalls of the overlay mark become serious from the wafer center to the wafer edge. Hence, the phenomenon of the unbalanced thickness on both sidewalls of the overlay mark is known as the self-shadowing effect. As shown in FIG. 1, during the formation of a material layer 106 over a material layer 102 having an overlay mark 104 on a substrate, the self-shadowing effect happens and becomes more obvious from the wafer center to the wafer edge. Because the position which the material target for forming the material layer 106 is located is over the wafer, the atom accumulations at both sidewalls of the overlay mark are getting asymmetric from the wafer center to the wafer edge. Therefore, the center line A of the overlay mark 104 shifts to line B with a shifting amount $\Delta x$ after the material layer 106 is formed. The shifting amount $\Delta x$ is a function of wafer location. Usually, $\Delta x$ is zero at the wafer center and is increased from the wafer center to the wafer edge. This kind of overlay offset phenomenon is known as pattern scaling effect. Because the line A of the overlay mark 104 shifts to line B with a shifting amount $\Delta x$, the photomask for patterning the material 106 misaligns with the overlay mark 104 for with a shifting amount $\Delta x$. Therefore, the successive patterned material layers misaligns with each other with a shifting amount $\Delta x$.

As shown in FIG. 2, at the center region 202 of the wafer 200, the overlay between the element 210a and the element (not shown) under the element 210a is well controlled since the material target (not shown) is right above the center region 202 of the wafer 200. However, because the self-shadowing effect is more serious at the wafer edge 204, the element 210b partially covers the element 208b. Similarly, at the wafer edge 206, the element 210c partially covers the element 208c. Apparently, the partial covering between the element 210b and 208b at left-hand side of the wafer 200 is a mirror image of the partial covering between the element 210c and 208c at right-hand side of the wafer 200. Hence, for a single wafer, the alignment quality over the entire wafer is not consistent. Although the real shifting amount can be inspected in the after etching inspection (AEI), it is too late to rework the patterned material layer with a poor overlay performance after the etching process.

Figure 3A:
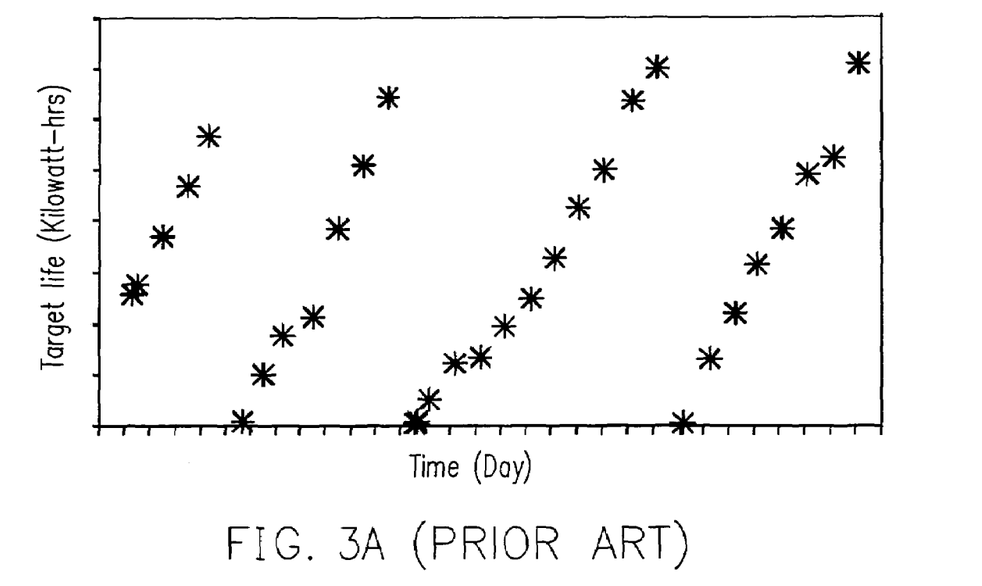
FIG. 3A is a Target Life-Time plot diagram.
Figure 3B:
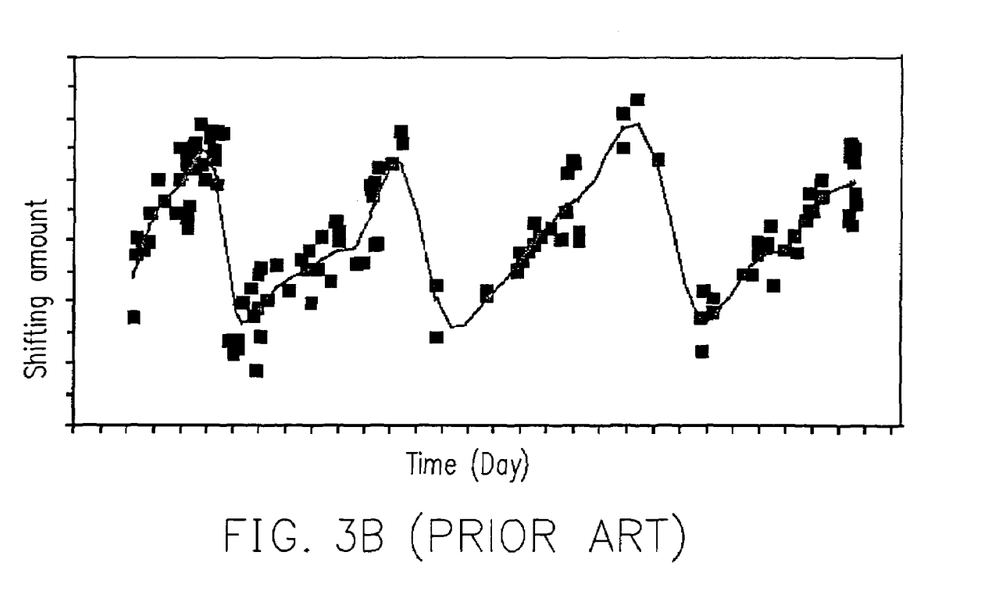
FIG. 3B is a Shifting amount-Time plot diagram.

FIG. 3A is a Target Life-Time plot diagram. FIG. 3B is a Shifting amount-Time plot diagram. As shown in FIG. 3A and FIG. 3B, the shifting amount due to the self-shadowing effect is seriously affected by the life time of the material target for forming the material layer 106. That is, in the same region of the wafer, the shifting amount is not steady and varies with the target life time. Hence, even the overlay correlation set can be feedback compensated through AEI to adjust the alignment precision, the shifting amount changing from time to time makes the alignment process become more difficult to be controlled and predicted.

SUMMARY OF THE INVENTION

Accordingly, at least one objective of the present invention is to provide a method for determining an overlay correlation set between two successive patterned material layers. By using the method according to the present invention, the overlay correlation set at an exposure tool for patterning a material layer is free from the self-shadowing effect.

At least another objective of the present invention is to provide a method for insuring an alignment precision between two successive patterned material layers for each wafer in a wafer lot. By using the method according to the present invention, not only the overlay alignment for each wafer in the wafer lot is free from the variation of the process factors for run to run, but also, for a single wafer, the overlay quality of the entire wafer is consistent.

To achieve these and other advantages and in accordance with the purpose of the invention, as embodied and broadly described herein, the invention provides a method for determining an overlay correlation set between two successive patterned material layers on a substrate. The method comprises steps of providing a first material layer having a first overlay mark formed therein over the substrate and then using an exposure tool with a first overlay correlation set to form a patterned photoresist layer on the first material layer, wherein the patterned photoresist layer comprises a mark pattern and the mark pattern is located over the first overlay mark for defining a later formed second material layer on the first material layer to be a second overlay mark. Thereafter, a pre-process metrology overlay parameter set between the first overlay mark and the mark pattern is obtained. The first overlay correlation set at the exposure tool is adjusted according to the pre-process metrology overlay parameter set.

In the preferred embodiment of the present invention as described above, the first material layer further comprises a via formed therein at a device region of the substrate.

In the preferred embodiment of the present invention as described above, the patterned photoresist layer further comprises a device pattern over the via.

In the preferred embodiment of the present invention as described above, the second material layer is made of conductive material.

In the preferred embodiment of the present invention as described above, the material of the second material layer includes Tungsten.

The invention also provides a method for insuring an alignment precision between two successive patterned material layers for each wafer of a group of wafers, wherein, for each wafer of the group of wafers, a first material layer having a first overlay mark is formed over the wafer. The method comprises steps of performing a pilot run on a first wafer in the group of wafers. The pilot run comprises steps of using an exposure tool with a first overlay correlation set to form a patterned photoresist layer on the first material layer, wherein the patterned photoresist layer comprises a mark pattern and the mark pattern is located over the first overlay mark for defining a later formed second material layer on the first material layer to be a second overlay mark. Then, a pre-process metrology overlay parameter set between the first overlay mark and the mark pattern is obtained. The first overlay correlation set at the exposure tool is adjusted to be a second overlay correlation set according to the pre-process metrology overlay parameter set. After the pilot run, the patterned photoresist layer on the first wafer is removed and the first wafer inserted into the group of wafers. A photo lithography process and a patterning process are performed on each wafer in the group of wafers, wherein, for each wafer in the group of wafers, a second material layer having a second overlay mark is formed on the wafer with the use of the second overlay correlation set.

In the preferred embodiment of the present invention as described above, the first material layer further comprises a via formed therein at a device region of the substrate.

In the preferred embodiment of the present invention as described above, the patterned photoresist layer further comprises a device pattern over the via.

In the preferred embodiment of the present invention as described above, the second material layer is made of conductive material.

In the preferred embodiment of the present invention as described above, the first overlay correlation is zeroed before the pilot run is performed.

In the preferred embodiment of the present invention as described above, the material of the second material layer includes Aluminum, Tungsten and Copper.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 4:
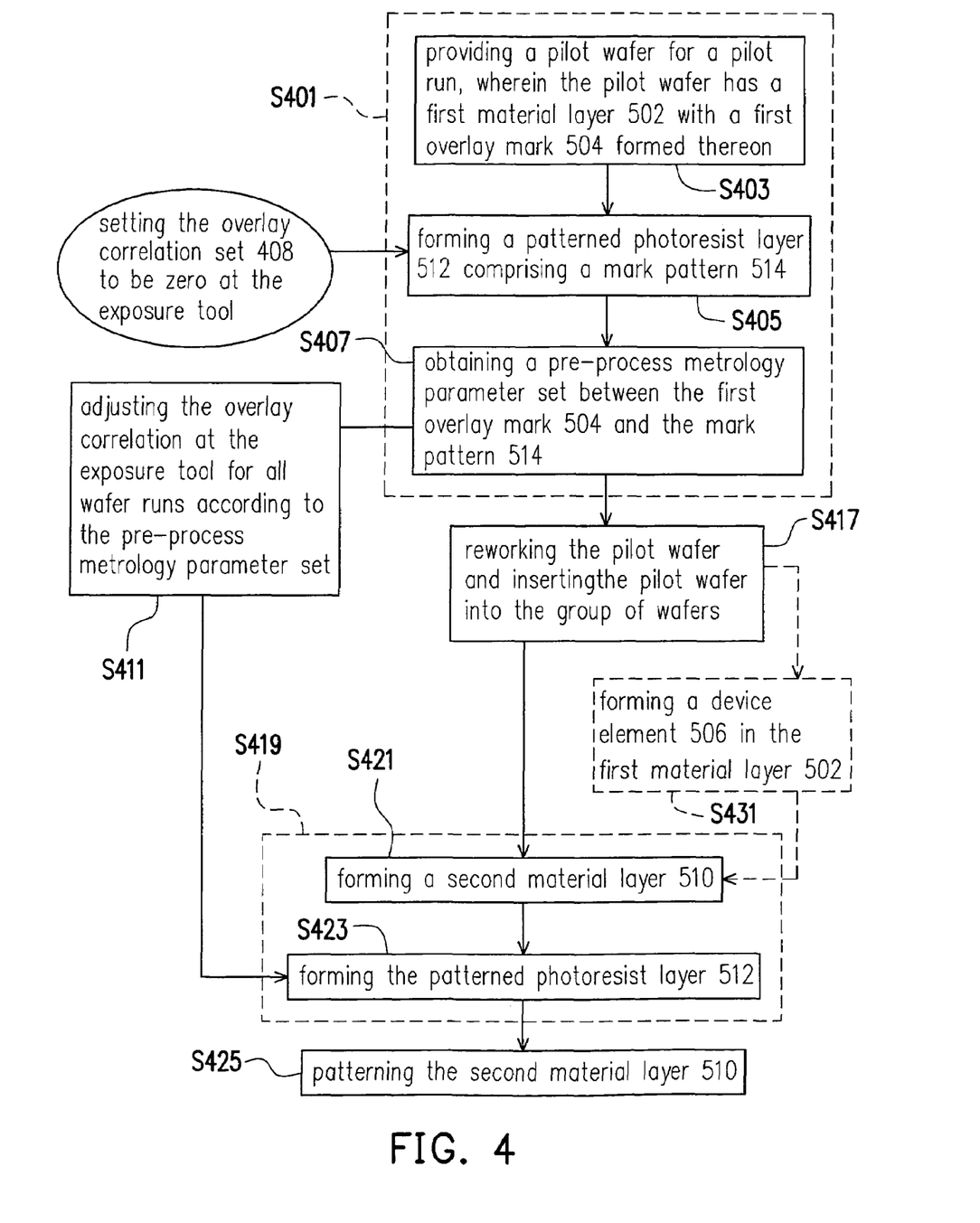
FIG. 4 is a flow chart showing a method for determining an overlay offset parameter set according to a preferred embodiment of the invention.
Figure 5A:
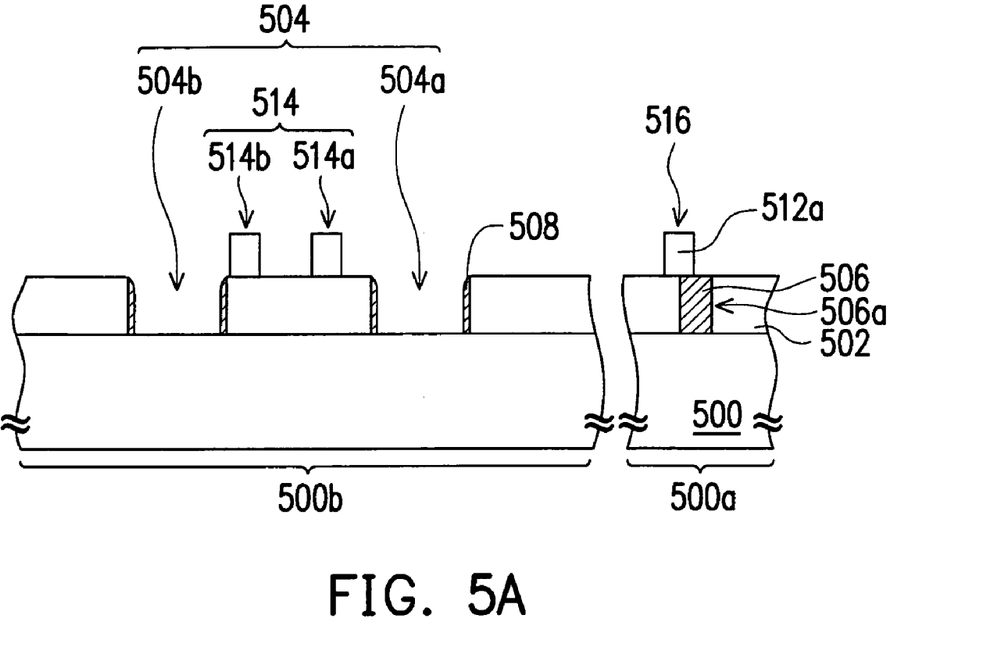
FIG. 5A is a cross-sectional view illustrating step for obtaining a pre-process metrology overlay parameter set between the first overlay mark and the mark pattern.
Figure 5B:
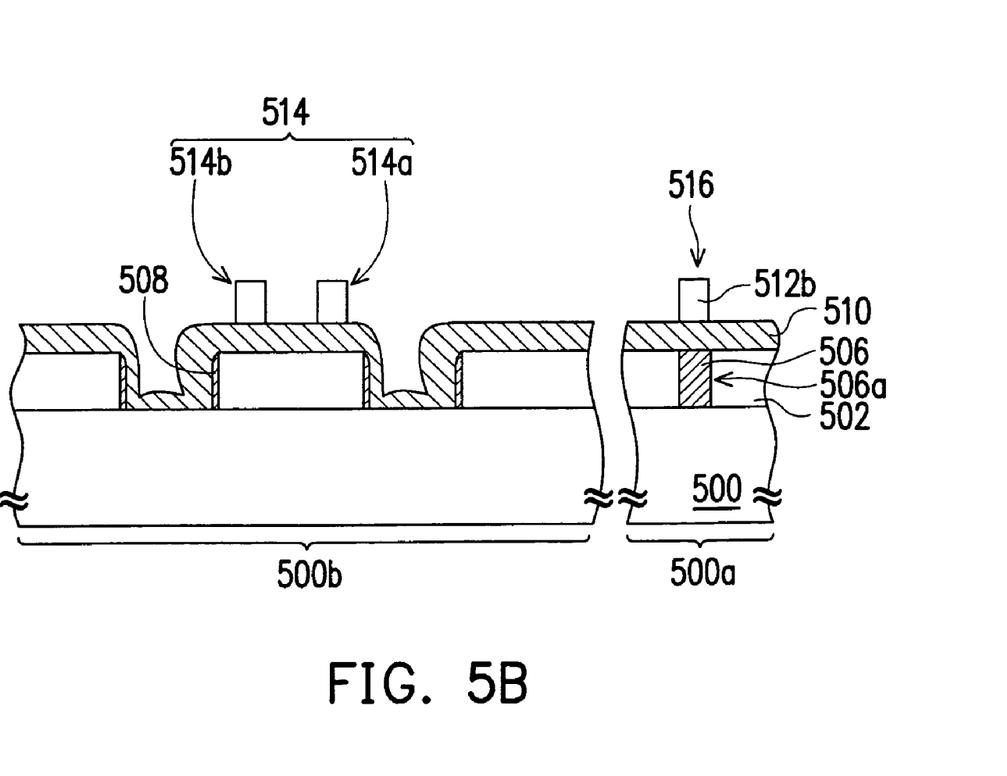
FIG. 5B is a cross-sectional view illustrating step for forming patterned photoresist layer according to a calibrated overlay correlation set 408 at the exposure tool.

FIG. 4 is a flow chart showing a method for determining an overlay offset parameter set according to a preferred embodiment of the invention. FIG. 5A is a cross-sectional view illustrating step for obtaining a pre-process metrology overlay parameter set between the first overlay mark and the mark pattern. FIG. 5B is a cross-sectional view illustrating step for forming patterned photoresist layer according to a calibrated overlay correlation set 408 at the exposure tool. As shown in FIG. 4, for a wafer lot containing several wafers, each wafer has a material layer possessing an overlay mark thereon. That is, as shown in FIG. 5A, for each wafer, a first material layer 502 having a first overlay mark 504 is formed on a substrate 500 of the wafer. The first material layer 502 can be, for example but not limited to, a dielectric layer. The material for forming the dielectric layer includes silicon oxide, for example. The first overlay mark 504 is located in an alignment region 500b of the substrate 500. In the preferred embodiment, the first overlay mark 504 is represented by two sub-marks 504a and 504b. However, the first overlay mark is not limited to be composed of only two sub-marks. In practice, the first overlay mark 504 can be composed of two pair of sub-marks. Furthermore, the sub-marks in the same pair are parallel to each other and the two sub-mark pairs are arranged to be perpendicular to each other.

Moreover, in a device region 500a of the substrate 500, a device element 506 is formed in the first material layer 502. The device element 506 can be a via or a contact. Furthermore, the method for forming the device element 506 comprises steps of forming a hole 506a together with the first overlay mark 504 in the material layer 502 and filling the hole 506a with a conductive material and then removing a portion of the conductive material until the surface of the first material layer 502 is exposed. The conductive material can be, for example but not limited to, tungsten. Also, the method for removing a portion of the conductive material can be, for example, chemical-mechanical polishing process and etching back process. Furthermore, because of the formation of the device element, trace amount of conductive material remains on the sidewall of the first overlay mark 504 to be a spacer 508.

As shown in FIG. 4, in the step S401, a pilot run is performed to obtain a pre-process metrology overlay parameter set. In the step S403, one wafer in the wafer lot is provided for the pilot run. In the preferred embodiment of the present invention, the wafer used in the pilot run is labeled as a pilot wafer. Thereafter, as showing FIG. 4 and FIG. 5A, in the step S405, for the pilot run, a patterned photoresist layer 512a having a mark pattern 514 and a device pattern 516 is formed on the first material layer 502 by using an exposure tool with the use of an overlay correlation set 408. The overlay correlation set 408 comprises an overlay offset parameter set. Before the pilot run, the overlay correlation set 408 at the exposure tool is set to be zero. Notably, the mark pattern 514 is located over the first overlay mark 504 in the alignment region 500b and the device pattern 516 is located over the device element 506 in the device region 500a. The mark pattern 514 is used as a mask for forming a second overlay mark (not shown) in the second material layer 510 over the first overlay mark 504. The device pattern 516 is used as a mask for forming a device element (not shown) in the second material layer 510 over the device element 506. In the preferred embodiment, the mark pattern 514 is represented by two sub-patterns 504a and 504b. However, the mark pattern is not limited to be composed of only two sub-patterns. In practice, the mark pattern 514 can be composed of two pair of sub-patterns. Furthermore, the sub-patterns in the same pair are parallel to each other and the two sub-mark pairs are arranged to be perpendicular to each other. Preferably, each sub-pattern of the mark pattern 514 is arranged respectively corresponding to one sub-mark of the first overly mark 504. Furthermore, it is prefer that the mark pattern 514 is a miniature of the first overlay mark 504 in a customized proportion. Therefore, the later formed second overlay mark is also a miniature of the first overlay mark 504 in the customized proportion.

In the step S407, a pre-process metrology overlay parameter set between the first overlay mark 504 and the mark pattern 514 is obtained. The pre-process metrology overlay parameter set comprises the position correlation between the sub-mark 504a and the sub-mark 514b and the position correlation between the sub-marks 504b and the sub-mark 514b respectively. After the pre-process metrology overlay parameter set is obtained, the overlay correlation set 408 at the exposure tool is adjusted according to the pre-process metrology overlay parameter set (step S411).

After the pilot run (step S401), the pilot wafer is reworked by removing the patterned photoresist layer 512a, and then the pilot wafer is inserted into the wafer lot (step S417). Thereafter, a photo lithography process is performed on each wafer in the wafer lot with the use of the adjusted overlay correlation set 408 (step S419). As shown in FIG. 4 and FIG. 5B, for each wafer in the wafer lot in the photo lithography process (step S419), a second material layer 510 (as shown in FIG. 5B) is formed over the substrate 500 (step S421) and then a patterned photoresist layer 512b having the mark pattern 514 is formed on the second material layer 510 (as shown in FIG. 5B) by using the exposure tool with the use of the adjusted overlay correlation set 408 (step S423). The second material layer 510 can be, for example but not limited to, formed of conductive material. Preferably, the second material layer 510 can be made of Aluminum, Copper or Tungsten.

Figure 5C:
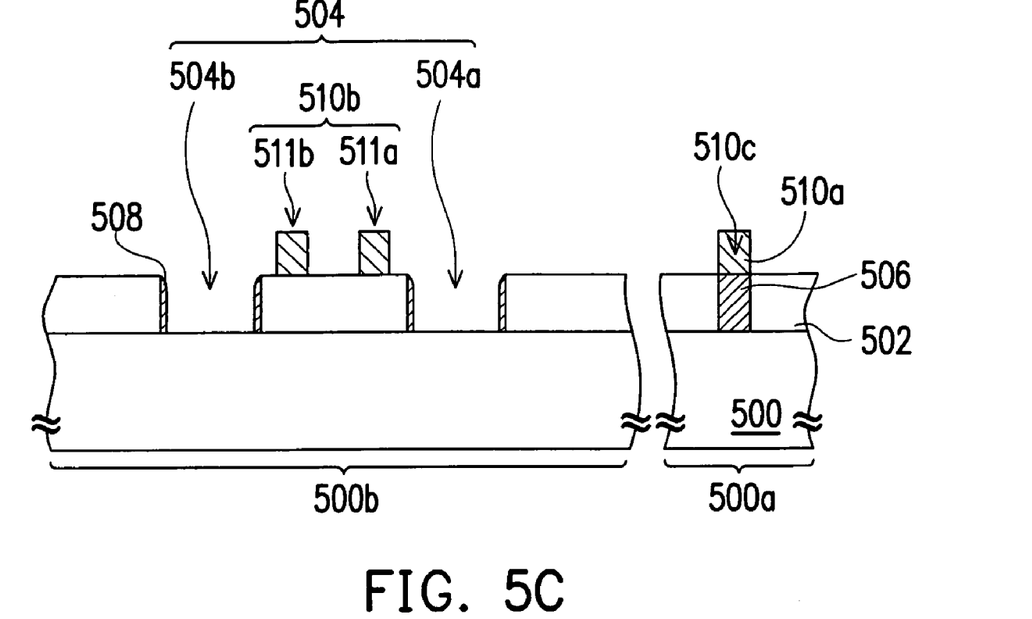
FIG. 5C is a cross-sectional view illustrating overlay alignment between the successive patterned material layers after a pilot run.

As shown in FIG. 5C together with FIG. 4, a patterning process is performed on each wafer in the wafer lot (step S425). As shown in FIG. 5C, for each wafer in the wafer lot, the patterned second material layer 510a having a second overly mark 510b and a device element 510c is formed over the substrate 100 by performing the patterning process, wherein the second overlay mark 510b is located over the first overlay mark 504 and the device element 510c is located over the device element 506. For each wafer in the patterning process (step S425), the second material layer 510 (as shown in FIG. 5B) is patterned with the use of the patterned photoresist layer 512b as a mask.

Figure 6:
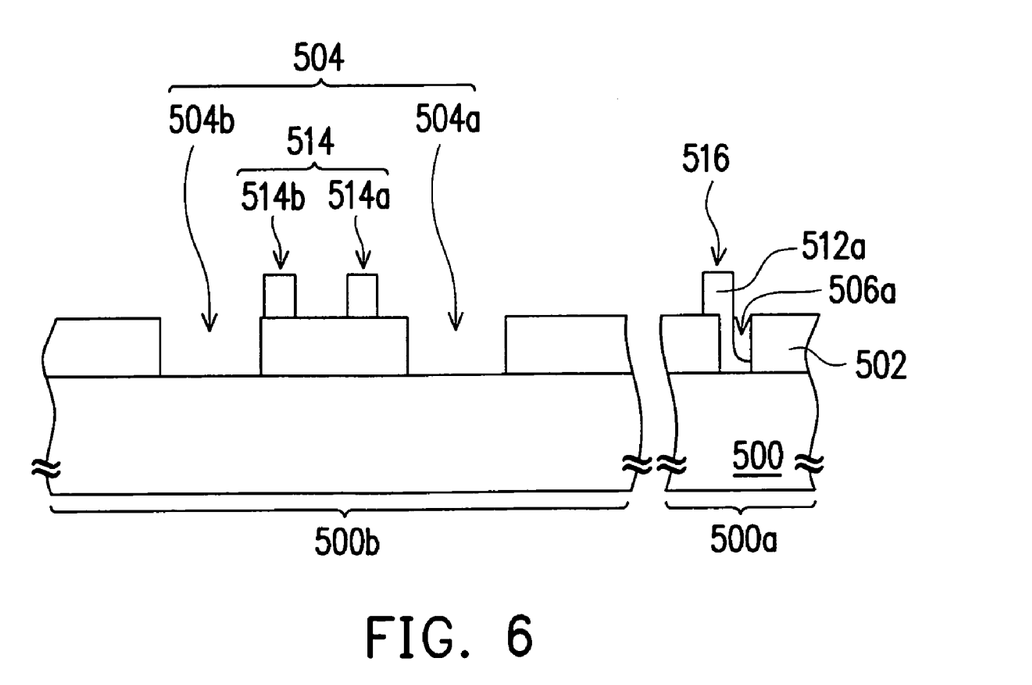
FIG. 6 is a cross-sectional view illustrating step for obtaining a pre-process metrology overlay parameter set between the first overlay mark and the mark pattern according to another embodiment of the present invention.

In the embodiment mentioned above, the pre-process metrology overlay parameter set 408 is obtained by measuring the position correlations between the first overlay mark in the first material layer and the mark pattern 514 after the hole 506a is filled with the device element 506. However, the invention is not limited to by the description made above. FIG. 6 is a cross-sectional view illustrating step for obtaining a pre-process metrology overlay parameter set between the first overlay mark and the mark pattern according to another embodiment of the present invention. It should be noticed that the elements in FIG. 6 are labeled with the number as same as number for the same element shown in FIG. 5A. As shown in FIG. 6, the pre-process metrology overlay parameter set can be obtained by directly forming a patterned photoresist layer 512a over the substrate 500 before the hole 506a is filled with the device element 506 in the pilot run. As shown in FIG. 4, for each wafer in the wafer lot, the device element 506 can be formed in the hole 506a after the pilot run and before the second material layer 510 is formed (step S431 labeled with dash in FIG. 4).

In the present invention, because the pre-process metrology overlay parameter set is obtained before the second material layer is formed, the pre-process metrology overlay parameter set truly reflects the alignment behavior between the overlay marks. That is, the pre-process metrology overlay parameter set is free from manufacturing variables including the self-shadowing effect of the second material layer at the overlay mark and the life time factor of the metal target for forming the second material layer. By referring to the pre-process metrology overlay parameter set, the shifting behavior of the mark pattern with reference to the first overlay mark can be precisely measured. That is, the adjusted overlay correlation set truly reflects the misalignment amount of the device pattern in the patterned photoresist layer at the device region without being interfered by the self-shadowing effect of the second material layer. Therefore, by adjusting the overlay correlation set according to the pre-process metrology overlay parameter set obtained from the pilot run, the overlay result between the device element in the second material layer corresponding to the device pattern in the patterned photoresist layer and the device element in the first material layer can be well controlled. As shown in FIG. 5C, for each wafer in the wafer lot, because the overlay correlation set at the exposure tool is re-adjusted according to the pre-process metrology overlay parameter set obtained from the pilot run, the device element 510c is precisely aligned to the device element 506.

Besides, for a single wafer, since the -pre-process metrology overlay parameter set obtained through the pilot run is free from the self-shadowing effect of the second material layer at the overlay mark and the life time factor of the metal target for forming the second material layer, the overlay result of successive patterned material layers can be well controlled even at the wafer edge. That is, the overlay quality at the wafer center is consistent with that at the wafer edge.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A method for determining an overlay correlation set between two successive patterned material layers on a substrate, the method comprising:

providing a first material layer having a first overlay mark formed therein over the substrate;

using an exposure tool with a first overlay correlation set to form a patterned photoresist layer on the first material layer, wherein the patterned photoresist layer comprises a mark pattern and the mark pattern is located over the first overlay mark for defining a later formed second material layer on the first material layer to be a second overlay mark;

obtaining a pre-process metrology overlay parameter set between the first overlay mark and the mark pattern; and adjusting the first overlay correlation set at the exposure tool according to the pre-process metrology overlay parameter set.

2. The method of claim 1, wherein the first material layer further comprises a via formed therein at a device region of the substrate.

3. The method of claim 2, wherein the patterned photoresist layer further comprises a device pattern over the via.

4. The method of claim 1, wherein the second material layer is made of conductive material.

5. The method of claim 1, wherein the material of the second material layer includes tungsten.

6. A method for insuring an alignment precision between two successive patterned material layers for each wafer of a group of wafers, wherein, for each wafer of the group of wafers, a first material layer having a first overlay mark is formed over the wafer, the method comprising:

performing a pilot run on a first wafer in the group of wafers, wherein the pilot run comprises:

using an exposure tool with a first overlay correlation set to form a patterned photoresist layer on the first material layer, wherein the patterned photoresist layer comprises a mark pattern and the mark pattern is located over the first overlay mark for defining a later formed second material layer on the first material layer to be a second overlay mark;

obtaining a pre-process metrology overlay parameter set between the first overlay mark and the mark pattern;

adjusting the first overlay correlation set at the exposure tool to be a second overlay correlation set according to the pre-process metrology overlay parameter set;

removing the patterned photoresist layer on the first wafer and inserting the first wafer into the group of wafers; and performing a photo lithography process and a patterning process on each wafer in the group of wafers, wherein, for each wafer in the group of wafers, a second material layer having a second overlay mark is formed on the wafer with the use of the second overlay correlation set.

7. The method of claim 6, wherein the first material layer further comprises a via formed therein at a device region of the substrate.

8. The method of claim 7, wherein the patterned photoresist layer further comprises a device pattern over the via.

9. The method of claim 6, wherein the second material layer is made of conductive material.

10. The method of claim 6, wherein the first overlay correlation set is zeroed before the pilot run is performed.

11. The method of claim 6, wherein the material of the second material layer includes Aluminum, Tungsten and Copper.

* * * * *

UNITED STATES PATENT AND TRADEMARK OFFICE
CERTIFICATE OF CORRECTION

PATENT NO. : 7,645,546 B2  Page 1 of 1
APPLICATION NO. : 11/348830
DATED : January 12, 2010
INVENTOR(S) : Yang et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1012 days.

Signed and Sealed this

Sixteenth Day of November, 2010

David J. Kappos
*Director of the United States Patent and Trademark Office*